(12) United States Patent
Rinard et al.

(10) Patent No.: US 10,502,797 B2
(45) Date of Patent: Dec. 10, 2019

(54) CROSSED-LOOP RESONATORS

(71) Applicant: Colorado Seminary, which owns and operates the University of Denver, Denver, CO (US)

(72) Inventors: George Rinard, Longmont, CO (US); Gareth Eaton, Denver, CO (US)

(73) Assignee: Colorado Seminary, Which owns and operates the University of Denver, Denver, CO (US)

( * ) Notice: Subject to any disclaimer, the term of this patent is extended or adjusted under 35 U.S.C. 154(b) by 1015 days.

(21) Appl. No.: 14/414,369

(22) PCT Filed: Jul. 19, 2013

(86) PCT No.: PCT/US2013/051219
§ 371 (c)(1),
(2) Date: Jan. 12, 2015

(87) PCT Pub. No.: WO2014/015219
PCT Pub. Date: Jan. 23, 2014

(65) Prior Publication Data
US 2015/0185299 A1   Jul. 2, 2015

Related U.S. Application Data

(60) Provisional application No. 61/673,305, filed on Jul. 19, 2012.

(51) Int. Cl.
*G01R 33/34* (2006.01)
*G01R 33/345* (2006.01)
(Continued)

(52) U.S. Cl.
CPC ........... *G01R 33/34* (2013.01); *G01R 33/345* (2013.01); *G01R 33/34046* (2013.01);
(Continued)

(58) Field of Classification Search
CPC .............. G01R 33/34; G01R 33/34053; G01R 33/34061; G01R 33/34092;
(Continued)

(56) References Cited

U.S. PATENT DOCUMENTS 4,714,886 A * 12/1987 Halpern ............... G01R 33/345
324/316
5,068,611 A    11/1991 Savelainen
(Continued)

FOREIGN PATENT DOCUMENTS

| EP | 0567116 | 7/2000 |
|----|---------|--------|
| EP | 2378281 | 10/2011 |
| WO | 2010043548 | 4/2010 |

OTHER PUBLICATIONS

Blumich, B. et al., NMR with excitation by Frank sequences. J. Magn. Reson. 199 (2009) 18-24.
(Continued)

*Primary Examiner* — G. M. A Hyder
(74) *Attorney, Agent, or Firm* — Maschoff Brennan

(57) ABSTRACT

Embodiments of the invention are directed toward a crossed-loop electron paramagnetic resonance resonator comprising a first resonator having a first resonator axis; and a second resonator having a second resonator axis. The first resonator axis and the second resonator axis can be substantially perpendicular. Either or both the first resonator and the second resonator can be a ribbon resonator having a plurality of metallic ribbons formed in a loop. Each metallic ribbon can include a central axis. The plurality of metallic ribbons can be arranged parallel relative one to another.

10 Claims, 5 Drawing Sheets

(51) Int. Cl.
   *G01R 33/36* (2006.01)
   *G01R 33/60* (2006.01)

(52) U.S. Cl.
   CPC . *G01R 33/34053* (2013.01); *G01R 33/34061* (2013.01); *G01R 33/34092* (2013.01); *G01R 33/3657* (2013.01); *G01R 33/3456* (2013.01); *G01R 33/60* (2013.01)

(58) Field of Classification Search
   CPC .......... G01R 33/34046; G01R 33/345; G01R 33/3456; G01R 33/60
   See application file for complete search history.

(56) References Cited

U.S. PATENT DOCUMENTS

| | | | |
|---|---|---|---|
| 5,296,802 | A | 3/1994 | Beranger et al. |
| 5,739,690 | A * | 4/1998 | Rinard ............... G01R 33/343 324/316 |
| 6,046,586 | A | 4/2000 | Rinard |
| 6,104,231 | A | 8/2000 | Kirkpatrick, II |
| 6,150,817 | A | 11/2000 | Lurie et al. |
| 6,177,797 | B1 | 1/2001 | Srinivasan |
| 6,304,230 | B1 | 10/2001 | Panther et al. |
| 6,917,201 | B2 | 7/2005 | de Swiet |
| 7,068,034 | B2 | 6/2006 | de Swiet |
| 8,217,653 | B2 | 7/2012 | Vaughan |
| 8,405,393 | B2 | 3/2013 | Tseitlin et al. |
| 8,730,697 | B2 | 5/2014 | Kim et al. |
| 9,110,146 | B2 | 8/2015 | Czechowski et al. |
| 2005/0017720 | A1 * | 1/2005 | Mett ................ G01R 33/30 324/321 |
| 2005/0146331 | A1 * | 7/2005 | Flexman .......... G01R 33/34046 324/318 |
| 2009/0001964 | A1 | 1/2009 | Strzalkowski |
| 2009/0310703 | A1 | 12/2009 | Han et al. |
| 2011/0018534 | A1 | 1/2011 | Peukert et al. |
| 2011/0210737 | A1 | 9/2011 | Tseitlin et al. |
| 2011/0241667 | A1 | 10/2011 | Blumich et al. |
| 2013/0257431 | A1 * | 10/2013 | Tseitlin ............. G01R 33/60 324/316 |
| 2015/0185255 | A1 | 7/2015 | Eaton et al. |

OTHER PUBLICATIONS

European Search Report, as issued in connection with European Application No. 11751109.7, dated Apr. 16, 2014, 13 pgs.

European Search Report, Supplemental, as issued in connection with European Application No. 11751109.7, dated May 6, 2014, 1 pg.

Fuhs, M. et al., Fourier-Transform EPR at High-Field High-Frequency. J. Magn. Reson. 149, 1 (Mar. 1, 2001) 67-73.

International Search Report and Written Opinion, as issued in connection with International Patent Application No. PCT/US2011/026231, dated Apr. 20, 2011, 8 pgs.

International Search Report and Written Opinion, as issued in connection with International Patent Application No. PCT/US2013/051219, dated Jan. 9, 2014, 8 pgs.

International Search Report and Written Opinion, as issued in connection with International Patent Application No. PCT/US2013/059726, dated Apr. 9, 2014, 11 pgs.

Joshi, J.P. et al., Rapid-Scan EPR with Triangular Scans and Fourier Deconvolution to Recover the Slow-Scan Spectrum. J. Magn. Reson. 175 (2005) 44-51.

Morton, J.J.L. et al., Solid-state quantum memory using the 31P nuclear spin. Nature 455 (2008) 1095-1088.

Owenius, R. et al. Frequency (250 MHz to 9.2 GHz) and Viscosity Dependence of Electron Spin Relaxation of Triarylmethyl Radicals at Room Temperature. J. Magn. Reson. 172 (2005) 168-175.

Prisner, T. et al. ESR with Stochastic Excitation. J. Magn. Reson. 84, 2 (Sep. 1, 1989) 296-308.

Pursley, R. et al. Stochastic Excitation and Hadamard Correlation Spectroscopy with Bandwidth Extension in RF FT-EPR. J. Magn. Reson. 162, 1 (May 1, 2003) 35-45.

Quine, R.W. et al., Fast-Response VHF Pulsed 2 KW Power Amplifiers. Conc. Magn. Reson. B (Magn. Reson. Engin.) 29B (2006) 185-190.

Quine, R.W. et al., Fast-response VHF pulsed power amplifiers. Conc. Magn. Reson. B (Magn. Reson. Engin.) 27B (2005) 1-7.

Quine, R.W. et al., A Pulsed and Continuous Wave 250 MHz Electron Paramagnetic Resonance Spectrometer. Mgn. Reson. Engineer. 15 (2002) 59-91.

Rinard, G.A. et al., 250 MHz Crossed Loop Resonator for Pulsed Electron Paramagnetic Resonance. Magn. Reson. Engineer. 15 (2002) 37-46.

Rinard, G.A. et al., A wire-crossed-loop resonator for rapid scan EPR. Concepts in Magn. Reson. Part B. 378, 2 (Apr. 9, 2010) 86-91.

Rinard, G.A. et al., An L-Band Crossed-Loop (Bimodal) EPR Resonator. J. Magn. Reson. 144, 1, (May 1, 2000) 85-88.

Stoner, J.W. et al., Direct-detected rapid-scan EPR at 250 MHz. J. Magn. Res. 170 (2004) 127-135.

Tseitlin, M. et al., Background Removal Procedure for Rapid Scan EPR. J. Magn. Reson. 196 (2009) 48-53.

Tseitlin, M. et al., Use of the Frank Sequence in Pulsed EPR. J. Magn. Reson. 209, 2 (Feb. 3, 2011) 306-309.

U.S. Office Action in U.S. Appl. No. 12/942,386, dated Jan. 6, 2012, 9 pgs.

U.S. Office Action in U.S. Appl. No. 12/942,386, dated Jun. 7, 2012, 11 pgs.

U.S. Notice of Allowance in U.S. Appl. No. 12/942,386, dated Nov. 26, 2012, 9 pgs.

U.S. Office Action in U.S. Appl. No. 13/789,383, dated Nov. 10, 2015, 9 pgs.

International Search Report and Written Opinion dated Jan. 9, 2014 on PCT application No. PCT/US13/051219 (pp. 13).

* cited by examiner

CROSSED-LOOP RESONATORS

BACKGROUND

Electron paramagnetic resonance (EPR) spectroscopy and electron spin resonance (ESR) spectroscopy are generally used to study molecular structure in chemistry, physics, biology, and medicine. EPR is also used to determine electron wave functions, lifetimes, and impurities in dielectrics used in solid state sciences. Prior EPR spectrometers comprise four main components: 1) a magnet to provide a steady DC magnetic field; 2) a high Q factor microwave resonator in which a sample is placed; 3) a microwave bridge capable of producing an oscillating electromagnetic field which is coupled via a waveguide, coaxial cable, or the like to the resonator; and 4) a signal detector with field modulation, signal amplification and display systems.

In EPR, a steady magnetic field is applied to the chemical sample in the microwave resonator. The steady magnetic field causes the electrons in the sample to precess at a frequency defined by the sample composition. The precession frequency is called the paramagnetic resonant frequency and is proportional to the intensity of the applied steady magnetic field. The precession is altered by application of high frequency energy when the frequency of the energy is near the paramagnetic resonance frequency. If the sample contains unpaired electrons, the precession change can be detected. A comparison of change in electron precession as a function of magnetic field or frequency provides valuable information relating to the chemical characteristics of the sample.

A typical EPR spectrometer uses a reflection type measurement on the electrical resonator that contains the sample. In a reflection type spectrometer a single resonator is used. The sample is placed in the resonator and microwave energy is injected via a waveguide, coaxial cable, or the like into the resonator while the sample and resonator are positioned in the steady magnetic field. A microwave device called a circulator is usually used to separate the desired EPR signal from the microwave source power. A disadvantage of the reflection mode of operation is that any portion of the microwave source power that is reflected from the resonator will interfere with the EPR signal generated in the resonator. In one type of measurement, also called "continuous wave" because the input microwave energy is applied as a continuous AC signal, the resonator is tuned to provide minimal reflection of the input energy.

Analysis is accomplished by sweeping the magnetic field or the microwave frequency source until the precession frequency matches the frequency of the input microwave power. When the two frequencies are the same, microwave energy is absorbed by the sample resulting in reflected energy that can be detected by the detector electronics.

In conventional CW, reflection type spectrometers; phase-sensitive detection at the magnetic field modulation frequency is used to improve the signal-to-noise. One disadvantage of this for continuous wave (CW) measurements is that the EPR signal is minute compared to the magnitude of the injected microwave energy. The signal detector must detect the EPR signal while separating out the injected microwave energy. It has proved difficult to completely separate the EPR signal from the input power.

Another difficulty arises in that any parasitic reflection of the microwave source caused by improper coupling of the input power to the resonator may create significant noise in the EPR signal. In addition, the source input waveguide and the detector waveguide can be considered to be critically coupled to the resonator to prevent a large reflection of the input power that would add to the EPR signal and saturate the detector electronics.

Phase noise or noise frequency modulation of the microwave source is converted to noise amplitude modulation in the reflected signal by the resonator, creating further noise in the EPR signal. Phase noise cannot be eliminated from microwave sources. It can be reduced but this can be expensive. Since the phase noise intensity is proportional to the source intensity, it becomes more serious at higher powers. Hence, current EPR tools must be operated at low power which in turn requires larger samples. A phase or dispersion component of the reflected EPR signal is difficult or impossible to study in reflection-type spectrometers because of this phase noise.

EPR tools can also be used for pulse-type measurements such as electron spin echo (ESE). In pulse type measurements, the input energy is provided by a high power pulse rather than a continuous wave microwave source. The pulse causes a near instantaneous change in the precession and a gradual decay as the sample returns to the baseline state created by the DC magnetic field. In this type of measurement the difficulty in separating input power from the EPR signal requires a delay after the application of the input pulse before a measurement can be made. Because the energy stored in the resonator by the input pulse must "ring-down" or dissipate before a measurement can be taken, much of the ESE signal can be lost in a reflection-type spectrometer.

Two types of resonators may be used in EPR spectrometry. Cavity resonators were used in early spectrometers due to their easily modeled performance, availability, and high Q factor. Cavity resonators are called distributed element circuits because the microwave, magnetic, and electric field are continuously distributed and mix throughout the cavity. Characteristic dimensions of cavity resonators are of the same order of magnitude as the wavelength of the electromagnetic fields used. More recently, lumped element resonators have been suggested because their dimensions can be much smaller than the wavelengths of interest.

Lumped element resonators have much less mixing of the microwave, magnetic and electric fields; each is confined largely to separate physical areas of the resonator. The area where the magnetic field is concentrated can be identified primarily as an inductor. The area where the electric field is concentrated is identified primarily as a capacitor. A term used to describe some of these lumped element resonators is "loop-gap resonators". In this case, the loop is primarily inductive and the gap is primarily capacitive. In loop-gap resonators used for spectrometers, the sample is positioned in the loop so as to interact with the magnetic field.

Most loop-gap resonators are used in the reflection type spectrometers discussed above. Conventional loop-gap resonators have low Q factor compared to cavity resonators, however, because the magnetic field is concentrated in the vicinity of the sample, good EPR signals can be obtained.

One means that has been tried in order to reduce the problems associated with reflection type resonators is a bimodal resonator. A bimodal resonator structure would take advantage of the fact that the EPR signal is circularly polarized. In other words, the EPR signal is a rotating vector field and is equivalent to two signals that are 90 degrees out of phase in space and time. One of these EPR signals is coupled to the input source and can be detected in the conventional reflection type spectrometers discussed above. A bimodal resonator is a structure that detects the other EPR signal that is isolated from the input source. In theory, if two uncoupled modes with microwave magnetic fields oriented 90 degrees in space could be excited in a resonator, one mode might be used to couple microwave energy into the sample and the other to detect the EPR signal. Hence, the bimodal resonator design promises to offer superior separation of input power from the EPR signal and make the EPR spectrometer immune to noise caused by reflected input power or phase noise.

Rapid scan is an electron paramagnetic resonance (EPR) method in which the magnetic field is scanned through resonance in a time that is short relative to $T_2$, and the absorption and dispersion signals are recorded by direct detection. Phase-sensitive detection at the magnetic field modulation frequency is not used. Oscillations are observed on the trailing edge of the signal. Rapid scan signals obtained with either triangular or sinusoidal scans can be deconvolved to give the conventional spectra.

SUMMARY

Embodiments of the invention are directed toward a crossed-loop electron paramagnetic resonance resonator (EPR) comprising a first resonator having a first resonator axis; and a second resonator having a second resonator axis. The first resonator axis and the second resonator axis can be substantially perpendicular. Either or both the first resonator and the second resonator can be a ribbon resonator having a plurality of metallic ribbons formed in a loop. Each metallic ribbon can include a central axis. The plurality of metallic ribbons can be arranged parallel relative one to another.

In some embodiments, the second resonator is different type of resonator than the first resonator. In some embodiments, the ribbon resonator can include two elongated metallic strips coupled to at least a subset of the metallic ribbons. The two elongated metallic strips can be disposed parallel to the central axis of the subset of the metallic ribbons. In some embodiments, each metallic ribbon is discontinuous between the two elongated metal strips. In some embodiments, the ribbon resonator can include a plurality of capacitors, wherein each capacitor is coupled with each of the two elongated metallic strips. In some embodiments, the ribbon resonator can include a plurality of chip capacitors, wherein each chip capacitor is coupled with each of the two elongated metallic strips. In some embodiments, the electron paramagnetic resonance resonator is adapted to work with rapid scan electron paramagnetic resonance.

In some embodiments, the first resonator comprises the ribbon resonator and the second resonator comprises a resonator selected from the group consisting of a resonator having at least one of the following topologies; cavity, helical, solenoidal, slotted tube, split ring, loop gap, saddle coil, Alderman-Grant, Helmholtz, Birdcage, reentrant, surface coils of various types, scroll, Fabry-Perot, parallel coil, dielectric ring, dielectric disk, dielectric cylinder, whispering gallery, transmission line, and horn.

In some embodiments, the first resonator comprises the ribbon resonator and the second resonator comprises a resonator selected from the group consisting of a resonator comprising solid metal loops, wire loops, plated dielectric loops, and/or dielectric loop.

BRIEF DESCRIPTION OF THE DRAWINGS

Illustrative embodiments of the present invention are described in detail below with reference to the following drawing figures.

DISCLOSURE

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies.

This description should not be interpreted as implying any particular order or arrangement among or between various steps or elements except when the order of individual steps or arrangement of elements is explicitly described.

Embodiments of the invention disclosed herein can solve problems occurring in continuous wave EPR such as, for example, rapid scan EPR. Some embodiments of the invention can include an open cavity to facilitate many samples in the cavity and/or provide access to the sample(s) within the cavity, including in vivo studies. In some spectroscopic measurement it is desirable to be able to scan the magnetic field rapidly and/or over a wide range.

Embodiments of the invention include crossed-loop resonators for EPR applications. These crossed-loop resonators can include two resonators positioned orthogonally relative to one another and positioned to resonate over a sample cavity. One of these two resonators is a sample resonator and the other an excitation resonator. The excitation resonator can be coupled with an energy source and produce an RF field within a sample of interest. The sample resonator can detect excitations within the sample of interest. Each resonator may be tunable to change the frequency at which the resonator resonates. The sample resonator and the excitation resonator may comprise any type of resonator discussed herein or known in the art. In some embodiments, the cross-lopped resonator does not include a reentrant loop.

The basic idea of crossed-loop (or orthogonal) resonators has been used in magnetic resonance for years. But even with magnetic resonance the challenge of finding practical resonators has proven difficult. And practical working resonators at the frequencies used for EPR have proven to be more elusive. Some embodiments of the invention solve this problem.

Figure 1:
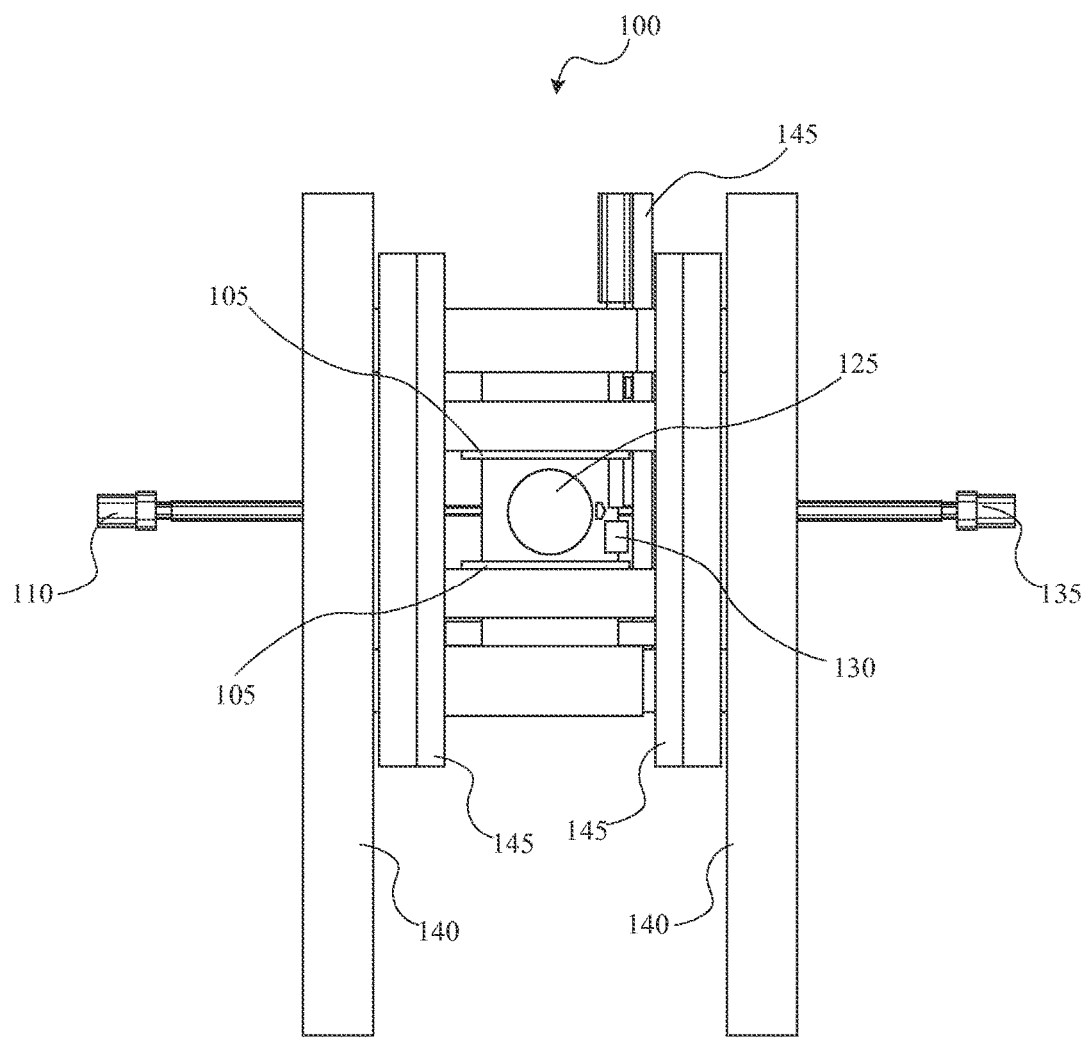
FIG. 1 is a diagram of a crossed-loop resonator according to some embodiments of the invention.

FIG. 1 is a diagram of a VHF crossed-loop resonator according to some embodiments of the invention. In some embodiments the entire assembly shown in FIG. 1 can be enclosed in an RF shield. In some embodiments, this shield can provide a common reentrant path for the two resonators together or individually. The sample resonator 125 can be constructed with a minimal amount of conductive material so as to allow good penetration of the RF field from the excitation resonator 105 and/or to minimize eddy currents induced by the rapidly scanning field, which can alter the uniformity of this field and cause line broadening in the EPR signal. For example, the support for the sample resonator 125 can be constructed from rexolite.

Figure 2:
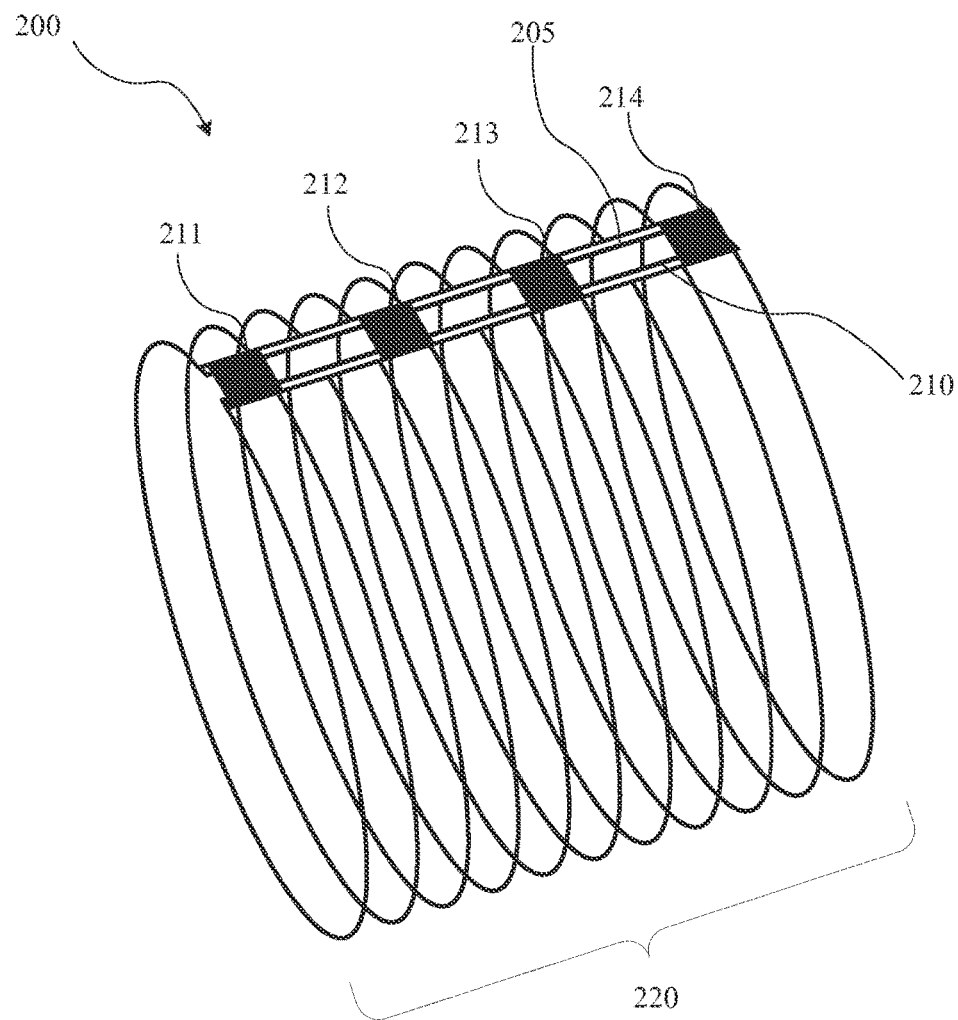
FIG. 2 is a wire loop resonator according to some embodiments of the invention.

In this example, the sample resonator 125 comprises a helical winding or loops of AWG No. 38 wire, which is 0.004 in. (0.1 mm) in diameter. The wire, for example, is wound helically on a 16 mm diameter thin Teflon form. In some embodiments, the sample resonator 125 can be connected in series with one or more capacitors; for example, one or more equally spaced non-magnetic chip capacitors as shown in FIG. 2. The Q factor, for example, of a 16 mm diameter sample resonator of this design was about 30 at a frequency of 250 MHz. This relatively low Q factor can provide a wide bandwidth of rapid scan signals that have a signal bandwidth proportional to the scan rate. Rapid scan EPR is particularly applicable for samples that lower the Q factor of the resonator.

In some embodiments, either the sample resonator 105 and/or the excitation resonator 125 can include a number of concentric loops of wire with their ends terminated in a pair of fine metal strips. FIG. 2 shows such a resonator. Resonator 200 includes a first metal strip 205 and second metal strip 210 coupled with each (or at least a plurality of) concentric loops 220. In some embodiments, each (or at least a plurality of) concentric loops 220 terminate at first metal strip 205 and second metal strip 210 leaving a gap in concentric loops 220 between first metal strip 205 and second metal strip 210. In some embodiments one or more chip capacitors 211, 212, 213 and 214 can bridge these strips. While four chip capacitors 211, 212, 213 and 214. are shown in the figure, any number can be used. The capacitance of chip capacitors 211, 212, 213 and 214 can be chosen to ensure that the loops resonate at the desired frequency using standard resonance equations known in the art. In some embodiments, chip capacitors 211, 212, 213 and 214 can be replaced by thin metal strips separated by a low loss dielectric such as Teflon or alumina. This can potentially produce a higher resonator Q factor than chip capacitors. Resonator 200 can be used for either or both the sample resonator 125 and the excitation resonator 105.

As shown in FIG. 1, in some embodiments, sample resonator 125 can be rigidly mounted to coil supports 145 and/or support columns 140. Coupling to sample resonator 125 can be either by capacitors in series or parallel with the resonator or by means of a magnetic loop. The coupling to sample resonator 125 can be variable or fixed at a point near critical coupling. In some embodiments, if the resonator Q factor is relatively low, frequency tuning may not be used. In some embodiments, frequency tuning may be used.

The Q factor (or quality factor) of a resonator is a dimensionless parameter that describes how under-damped the resonator is, or equivalently, characterizes a resonator's bandwidth relative to its center frequency. A higher Q factor indicates a lower rate of energy loss relative to the stored energy of the resonator. That is, the oscillations die out more slowly.

The excitation resonator 105 shown in FIG. 1 can include two loops of fine wire connected in series or parallel, for example, with chip capacitors. The loops can be spaced approximately at the Helmholtz spacing, with spacing equal to their radius, to produce a uniform RF field distribution over the sample resonator. In some embodiments, thin metal (e.g., copper) loops can be connected to a capacitor consisting of thin metal foil separated by a low loss dielectric to provide a higher Q factor and/or a higher power handling capability.

In some embodiments, a high Q factor in the excitation resonator 105 can be used. This can be useful, for example, since the resonator will produce a higher RF magnetic field for a given power. The bandwidth of excitation resonator 105 may not be an issue, since it is excited by a constant frequency source. The Helmholtz spacing of excitation resonator 105 can allow easy access to the sample and/or an unimpeded path for the scanned magnetic field. Excitation resonator 105 can be mounted such that its axis can be rotated about a line perpendicular to the axis of the sample resonator to achieve a maximum (or optimal or increased) isolation between the two resonators. Crossed-loop resonator 100, for example, can achieve an isolation of about 40 to 60 dB, which can eliminate phase noise in the EPR signal. Coupling to excitation resonator 105 can be either capacitive or by means of a magnetic loop. A trimmer capacitor can be positioned in parallel with the capacitor(s) of excitation resonator 105 and/or can be used to adjust the frequency of excitation resonator 105 to be the same as that of the sample resonator 125.

Crossed-loop resonant 100, which can be constructed of wire, is an example of one configuration of the crossed-loop resonator. Other configurations of resonators are feasible. In some embodiments, resonators can be used that allow for the RF energy from the excitation resonator to be relatively unimpeded and/or of the scanning field penetrating both resonators without excessive distortion in uniformity and without producing excessive eddy currents. In some embodiments, the interaction of the resonator and the scanning field may be minimized to prevent excessive background signals. In some embodiments, the sample resonator, for example, can be constructed as two Helmholtz like coils, with one or the other or both having a higher Q factor and/or eddy current effects only in the vicinity of the two coils at the extremes of the sample.

Excitation resonator 105 and/or sample resonator 125 can also be constructed from various dielectric or metal coated dielectric materials. Excitation resonator 105 and/or sample resonator 125 can also be coated, by any of the standard techniques in the desired pattern, to provide resonators with the desired Q factor and/or field transparency for rapid scan, pulse and/or CW applications. Coating techniques, for example, can include vacuum evaporation, chemical deposition, deposition followed by electroplating and even conductive painting.

Crossed-loop resonator 100 can be used at moderate frequencies, for example, at and/or between 250 MHz and 1 GHz. Other configurations are possible that can operate at higher frequencies. For example, crossed-loop resonator 100 could be configured to be used at frequencies up to 10 GHz, X band. One configuration, for example, for an X band crossed-loop resonator could be a dielectric resonator inside a cavity resonator. The magnetic fields of these two resonators could be aligned to be perpendicular to achieve good isolation. The cavity could be constructed of a dielectric with a metal plating thick enough to contain the RF energy but thin enough to allow penetration of the rapid scan field. Alternatively the cavity can be constructed of a closely wound coil of insulated wire.

The X band is a band of frequencies that is indefinitely set at approximately 7.0 to 11.2 gigahertz (GHz). or 8.0 to 12.0 GHz.

Figure 3:
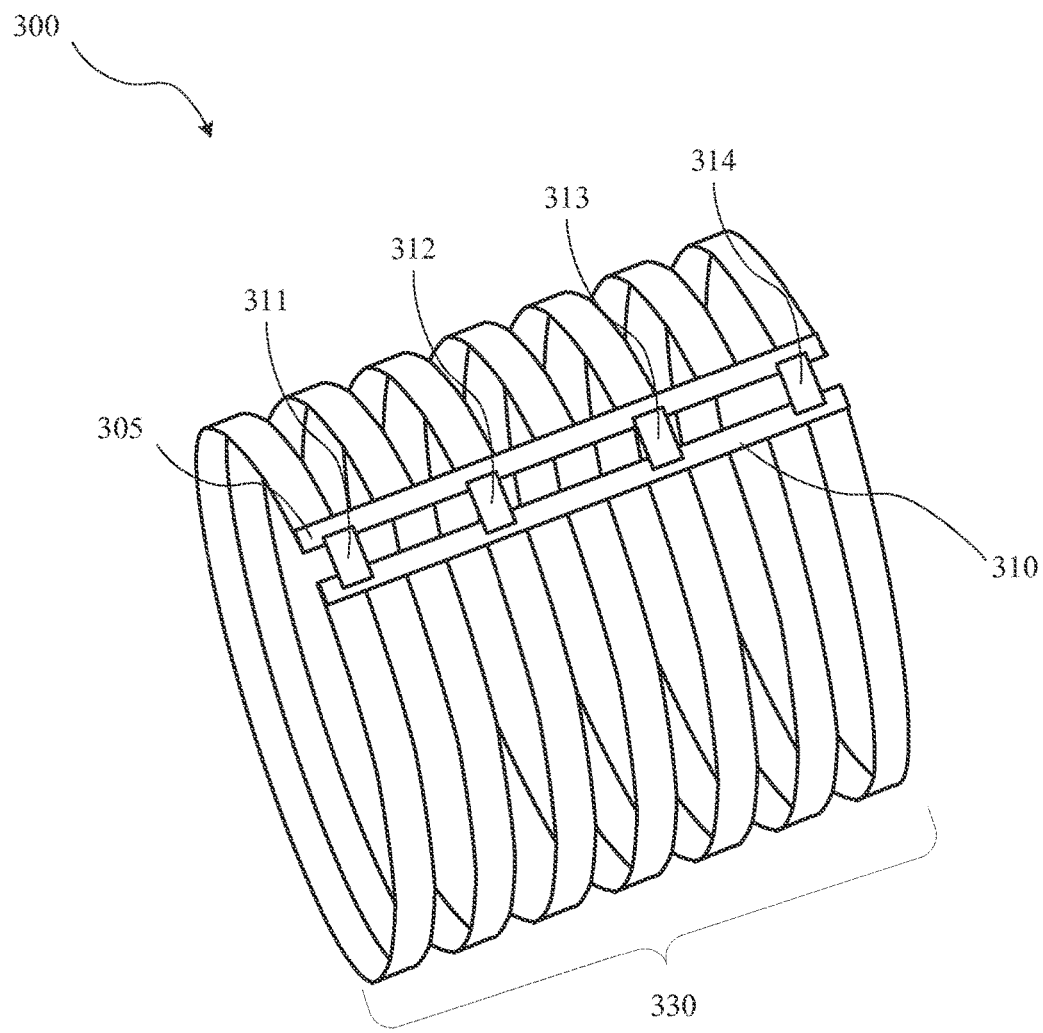
FIG. 3 is a ribbon loop resonator according to some embodiments of the invention.

In some embodiments either or both resonators can include a ribbon resonator as shown in FIG. 3. Ribbon resonator 300 can include a plurality of concentric ribbon loops 320 with ends terminated in first metal strip 305 and second metal strip 310. Each ribbon loop 320 can include a flat elongated sheet of metal formed, for example, in a circular or oval loop with the flat portion of the ribbon substantially parallel with the axis of the loop. Each ribbon loop 320 can be disposed parallel relative to one another and/or with parallel central axis. That is, the normal vector of the flat surface of the ribbon can point outward from the axis of the loop.

In some embodiments one or more capacitors 311, 312, 313 and 314 can bridge in first metal strip 305 and second metal strip. The capacitors 311, 312, 313 and 314, for example, can be chosen to ensure that the loops resonate at the desired frequency using standard resonance equations known in the art. In some embodiments, capacitors 311, 312, 313 and 314 can be chip capacitors. In some embodiments, the capacitors 311, 312, 313 and 314 can be replaced by thin metal strips separated by a low loss dielectric such as Teflon or alumina. This can potentially produce a higher resonator Q factor than chip capacitors.

The ribbon material that make up each ribbon loop 320 can allow for high electrical power within each loop of the resonator. In some embodiments this can provide more excitation power to the sample.

Figure 4:
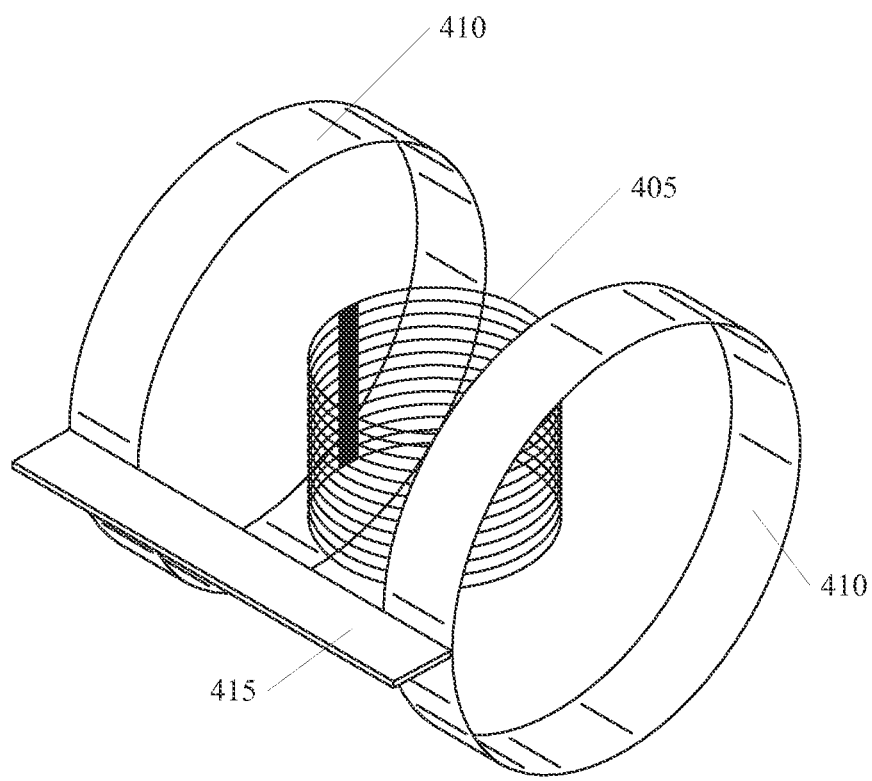
FIG. 4 shows a resonator according to some embodiments of the invention.

Another example of a crossed-loop resonator is shown in FIG. 4. Cross looped resonator 400 has excitation resonators 410 and sample resonator 405. Note that the axis of excitation resonators 410 and sample resonator 405 are perpendicular. Excitation resonator 410 can be larger than sample resonator 405. In some embodiments, excitation resonator 410 can be fabricated in a conventional Helmholtz configuration, which also incorporates parallel plate capacitor 415 (or any other type of capacitor) for resonance.

In some embodiments a tunable resonator can be used for either the excitation resonator and/or the sample resonator. Such a resonator can be tuned by changing the physical and/or electrical properties of the resonator. For example, the shape, length, diameter, capacitance, etc. of the resonator can be changed to tune the resonate frequency of the resonator.

In some embodiments a ribbon or wire loop resonator can include one or more capacitors coupled with the loop in series to improve the uniformity of the RF magnetic field and also to mitigate eddy currents. These capacitors can be placed at a distance of a fraction of a wavelength from each other; for example, ⅛, ¼ or ½ of a wavelength. These capacitors can be chip capacitors. In some embodiments capacitors can be placed every one and a half turns.

In some embodiments a crossed-loop resonator can work with frequencies up to 10 GHz or higher.

Figure 5:
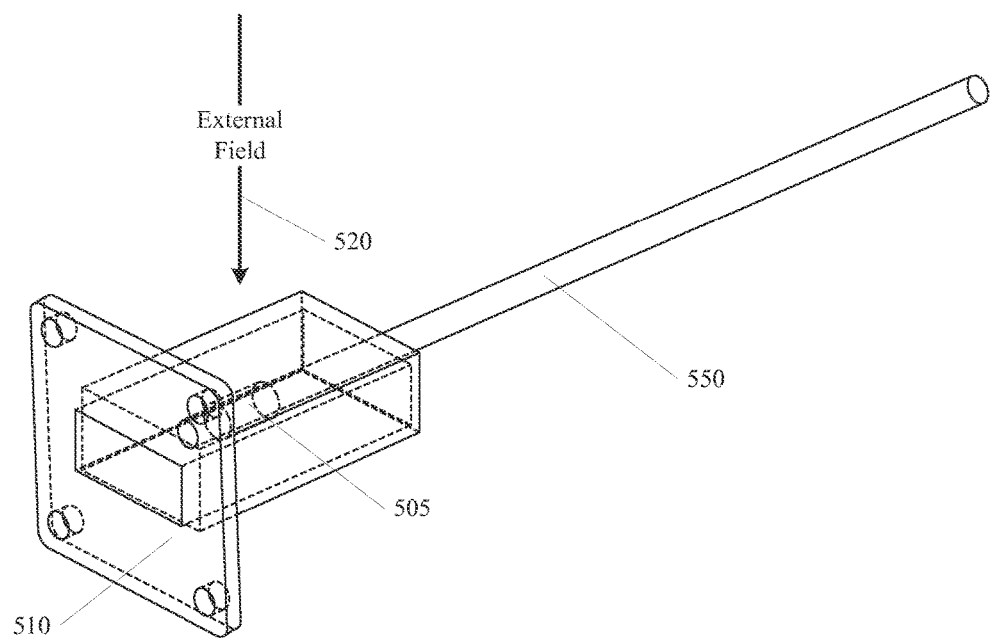
FIG. 5 shows an X band crossed-loop resonator that can be used in rapid scan EPR according to some embodiments of the invention.

In some embodiments the resonator can be used with rapid scan EPR. For example, FIG. 5 shows an X band crossed-loop resonator that can be used in rapid scan EPR according to some embodiments of the invention. This resonator includes cavity resonator 510 and dielectric resonator 505. Cavity resonator 510 can be a $TE_{102}$ resonator and/or can produces a maximum magnetic field in the center of the cavity which is orthogonal to external steady magnetic field 520 and the magnetic field in dielectric resonator 505, which is parallel to the axis of sample tube 550. Dielectric resonator 505 can be a short cylindrical tube, for example, with an outside diameter of about 10 mm, an inside diameter of about 5 mm, and length of about 13 mm. Dielectric resonator 505 can be substantially concentric with sample tube 550. Sample tube 550, for example, can be about 4 mm in diameter, and can be centered inside the cavity resonator 510.

In some embodiments, a crossed-loop resonator can include any combination of dissimilar resonators. For example, of the two resonators one resonator can be a wire loop resonator and the other a ribbon loop resonator. As another example, of the two resonators one resonator can be a wire or ribbon loop resonator and the other a dielectric resonator. As another example, of the two resonators one resonator can be a cavity resonator and the other a dielectric resonator.

In some embodiments, a crossed-loop resonator can include any combination of resonators whose electromagnetic properties produce fields that are substantially orthogonal to one another at least in the location of the sample to be measured by EPR. For example, a crossed-loop resonator can include two of the following resonators: solid metal, wire, ribbon, plated dielectric, and/or dielectric. As another example, a crossed-loop resonator can include any two resonators with the following topologies: cavity, helical, solenoidal, slotted tube, split ring, loop gap, saddle coil, Alderman-Grant, Helmholtz, Birdcage, reentrant, surface coils of various types, scroll, Fabry-Perot, parallel coil, dielectric ring, dielectric disk, dielectric cylinder, whispering gallery, transmission line, horn, and/or other resonant structure that works at a location of interest in the electromagnetic spectrum from low RF frequencies through the optical.

As a specific example, a crossed-loop resonator can include a concentric slotted tube resonator and a dielectric cylinder resonator. Such a crossed-loop resonator could be used, for example, as an X band resonator.

In some embodiments the frequencies of the two resonators of a crossed-loop resonator could be the same. In other embodiments, the frequencies of the two resonators could be different.

In some embodiments the resonator can include a sample cavity that has a diameter greater than 1, 2, 3, 4, 5, 6, 7, 8, 9, 10, 11 or 12 inches. In some embodiments the sample cavity can be more than 1, 2, 3, or 4 feet in diameter. In some embodiments the sample cavity can be large enough for a human being to be placed within the sample cavity.

Different arrangements of the components depicted in the drawings or described above, as well as components and steps not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

What is claimed is:

1. A crossed-loop electron paramagnetic resonance resonator comprising:
   a first resonator having a first resonator axis; and
   a second resonator having a second resonator axis, wherein the first resonator axis and the second resonator axis are substantially perpendicular, wherein both the first resonator and the second resonator comprise a ribbon resonator having a plurality of metallic ribbons formed in a loop, wherein each metallic ribbon includes a central axis, and wherein the plurality of metallic ribbons are arranged parallel relative one to another,
   wherein both ribbon resonators comprise two elongated metallic strips coupled to at least a subset of metallic ribbons, wherein the two elongated metallic strips are disposed parallel to the central axis of the subset of metallic ribbons.

2. The crossed-loop electron paramagnetic resonance resonator according to claim 1, wherein the second resonator is different type of resonator than the first resonator.

3. The crossed-loop electron paramagnetic resonance resonator according to claim 1, wherein each metallic ribbon is discontinuous between the two elongated metal strips.

4. The crossed-loop electron paramagnetic resonance resonator according to claim 1, wherein the ribbon resonator comprises a plurality of capacitors, wherein each capacitor is coupled with each of the two elongated metallic strips.

5. The crossed-loop electron paramagnetic resonance resonator according to claim 1, wherein the ribbon resonator comprises a plurality of chip capacitors, wherein each chip capacitor is coupled with each of the two elongated metallic strips.

6. The crossed-loop electron paramagnetic resonance resonator according to claim 1, wherein the electron paramagnetic resonance resonator is adapted to work with rapid scan electron paramagnetic resonance.

7. The crossed-loop electron paramagnetic resonance resonator according to claim 1, wherein the second resonator comprises a resonator selected from the group consisting of a resonator having at least one of the following topologies; cavity, helical, solenoidal, slotted tube, split ring, loop gap, saddle coil, Alderman-Grant, Helmholtz, Birdcage, reentrant, surface coils of various types, scroll, Fabry-Perot, Perot, parallel coil, dielectric ring, dielectric disk, dielectric cylinder, whispering gallery, transmission line, and horn.

8. A crossed-loop electron paramagnetic resonance resonator comprising:
  a first resonator having a first resonator axis; and
  a second resonator having a second resonator axis, wherein the first resonator axis and the second resonator axis are substantially perpendicular, and wherein either or both the first resonator and the second resonator resonates with a frequency within the X band frequencies,
  wherein either or both the first resonator and the second resonator comprise a ribbon resonator having a plurality of metallic ribbons formed in a loop, wherein each metallic ribbon includes a central axis, and wherein the plurality of metallic ribbons are arranged parallel relative one to another,
  wherein both ribbon resonators comprise two elongated metallic strips coupled to at least a subset of metallic ribbons, wherein the two elongated metallic strips are disposed parallel to the central axis of the subset of metallic ribbons.

9. The crossed-loop electron paramagnetic resonance resonator according to claim 8, further comprising a sample cavity defined by the first resonator, wherein the sample cavity has a diameter greater than 2 inches.

10. The crossed-loop electron paramagnetic resonance resonator according to claim 8, wherein the first resonator resonates at a frequency that is different than the second resonator.

* * * * *